United States Patent
Traub et al.

(10) Patent No.: US 10,562,295 B2
(45) Date of Patent: Feb. 18, 2020

(54) MASKED QUARTZ CRYSTAL MICROBALANCE FOR CALIBRATING AND MONITORING INKJET DISPENSERS

(71) Applicant: CANON KABUSHIKI KAISHA, Tokyo (JP)

(72) Inventors: Matthew C. Traub, Austin, TX (US); Whitney Longsine, Austin, TX (US); Antoine Dellinger, Liberty Hill, TX (US); Steven C. Shackleton, Austin, TX (US); Roger R. Wenzel, Jarell, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 16/024,383

(22) Filed: Jun. 29, 2018

(65) Prior Publication Data
US 2020/0001599 A1    Jan. 2, 2020

(51) Int. Cl.
*B41J 29/393* (2006.01)
*B41J 2/045* (2006.01)
*G03F 7/00* (2006.01)

(52) U.S. Cl.
CPC ....... *B41J 2/04508* (2013.01); *B41J 2/04586* (2013.01); *B41J 29/393* (2013.01); *G03F 7/0002* (2013.01)

(58) Field of Classification Search
CPC ........ H05K 3/12; H05K 3/1241; H05K 3/125; B41J 2/04508; B41J 2/04586; G03F 7/0002
See application file for complete search history.

(56) References Cited

U.S. PATENT DOCUMENTS

| | | | |
|---|---|---|---|
| 6,871,930 B2 | 3/2005 | Umetani | |
| 8,226,191 B2 | 7/2012 | Kim | |
| 8,764,144 B2 | 7/2014 | Kim | |
| 2003/0193539 A1* | 10/2003 | Umetani | B41J 2/0456 347/19 |

(Continued)

FOREIGN PATENT DOCUMENTS

JP    2007121250    *    5/2007    ............... G01N 5/02

OTHER PUBLICATIONS

Dong Liang et al , "Liquid volume measurement method for the picoliter to nanoliter volume range based on quartz crystal microbalance technology", Meas. Sci. Technol. 25 (2014) 095302. (Year: 2014).*

(Continued)

*Primary Examiner* — Huan H Tran
(74) *Attorney, Agent, or Firm* — Canon U.S.A., Inc. IP Division (57) ABSTRACT

A fluid dispenser calibration system includes a fluid dispenser having a plurality of nozzles, a balance having a balance surface, and a mask positioned between the fluid dispenser and the balance surface. A nozzle pitch is a distance between two adjacent nozzles. The balance measures mass of fluid dispensed from a single nozzle and measures a change in mass on the balance surface. The balance surface has a linear dimension that is greater than the nozzle pitch. The mask includes an aperture and a catch region. The aperture allows fluid dispensed from the single nozzle to impact the balance surface. The catch region catches fluid dispensed from remaining nozzles in the plurality of nozzles.

18 Claims, 11 Drawing Sheets

(56) References Cited

U.S. PATENT DOCUMENTS

2009/0195575 A1* 8/2009 Kim .................. B41J 2/125
                                                                          347/10
2015/0360400 A1   12/2015  Tsurumi
2017/0370884 A1* 12/2017  Jo ..................... G01N 29/022

OTHER PUBLICATIONS

Heng, "Quartz Crystal Microbalance: An Experimental Investigation on Liquid Properties", Session 2004/20005 (Year: 2004).*

Liang et al, "Nanoliter droplet characterization using vibrating crystal sensor with surface-attached polymer hydrogel coating", Proc. Eurosensors XXVI, Sep. 9-12, 2012, Kraków, Poland (Year: 2012).*

Google translation of JP 2007121250, published on May 2007. (Year: 2007).*

* cited by examiner

MASKED QUARTZ CRYSTAL MICROBALANCE FOR CALIBRATING AND MONITORING INKJET DISPENSERS

BACKGROUND OF THE INVENTION

Field of the Invention

The disclosure relates to using a quartz crystal microbalance to measure mass of fluid dispensed from an inkjet nozzle, which may be used in nanoimprint lithography to manufacture a semiconductor chip.

Description of the Related Art

Semiconductor chips have electronic circuit patterns that help run products used every day, from home appliances to automobiles and smartphones. Increasing the number of circuit patterns per chip increases the speed and lowers the costs per chip. One way to allow more circuit patterns to be place on a chip is to miniaturizing the electronic circuit patterns.

The electronic circuit patterns of semiconductor chips are made up of conductive material and connected by conductive material in the shape of lines called tracks or traces. Miniaturizing circuit patterns involves reducing the width of each line. In the early 1990s, a typical line width was 350 nanometers (nm). In the late 2000s, some systems were capable of producing 38 nm-resolution patterning. Nanoimprint lithography (NIL) can achieve line widths of at least 15 nm, providing the potential to significantly reduce production costs for semiconductor device manufacturers.

In nanoimprint lithography, inkjet nozzles of a print head shoot individual drops of fluid resin (resist material) onto a substrate so that the drops follow a circuit pattern. Then, a mold having a nano-circuit pattern is brought into direct contact with the resist material on the substrate surface. Similar to pressing a concave mold into clay to create a convex impression, the nano-pattern mold is pressed into the fluid resist to fabricate the resist material into minute circuit patterns on the substrate. Ultraviolet light then is used to solidify the resist and form the circuit pattern on the substrate, after which the mold is separated from the substrate, which now has a residual layer made up of an extremely sharp circuit pattern.

In nanoimprint lithography, the circuit patterns are formed using direct transfer. As such, the print head that shoots individual drops of resin requires calibration of picoliter (pL) level drop volume and micron-level placement accuracy. Calibrating a print head includes two main actions: evaluating placement of a drop and determining volume of a drop. Drifts in drop volume on-tool, either globally or from selected nozzles, can cause residual layer thickness (RLT) or residual layer thickness uniformity (RLTU) to fall out of specification. Tools to accurately and repeatedly measure drop volume are critical for understanding and improving inkjet performance.

Regarding fluid drop volume, maintaining uniformity between the volume of one drop to the next is important towards meeting residual layer thickness uniformity quality specifications. One way to determine drop volume is to dispense approximately 75 million drops onto a substrate supported by a scale, weigh the drop mass, and use the mass, the number of dispensed drops, and fluid density to determine an average volume of each drop. However, dispensing a fairly large number of drops on-tool creates difficult to deal-with waste, is time consuming, and, as the density of the drop pattern grows sparser, the time to print a sufficient number of drops goes up. Most fundamentally, it is an inherently averaged measurement, and does not capture any nozzle-to-nozzle volume variation.

Another way to determine drop volume is to use optical images of the drops in-flight. However, the drop-in-flight approach begins to hit limits at smaller drop volumes. For volumes of 0.6 pL and below, a 10% difference in drop volume represents a difference in expected drop diameter smaller than the diffraction limit for any long working distance objective. This represents a fundamental physical limit on drop measurement using this method. Even for somewhat larger drops, small changes in focus may introduce errors in absolute values.

Instead of imaging the drops in flight, drop volume may be determined by using optical images of the drops after they land on a substrate. However, estimating a three-dimension volume from a two-dimension image also presents limitations. In the case of estimating drop volumes from images dispensed on a substrate like a bare silicon wafer, the observed diameters depend not just on the drop volume but on the substrate/fluid contact angle. Other process effects like differential evaporation based on field location may also convolute results. Thus, extensive calibration is needed for each tool, substrate, and resist.

SUMMARY OF THE INVENTION

The disclosure is directed to systems and methods to calibrate a fluid dispenser. The systems and methods, in particular, can account for the crosstalk effects of neighboring firing nozzles which become more pronounced as drop volume gets smaller (i.e., single picoliter (pL) or less volumes).

According to an aspect of the present disclosure, a fluid dispenser calibration system includes a fluid dispenser having a plurality of nozzles, wherein a nozzle pitch is a distance between two adjacent nozzles, a balance having a balance surface and configured to measure mass of fluid dispensed from a single nozzle among the plurality of nozzles, wherein the balance is configured to measure a change in mass on the balance surface, and wherein the balance surface has a linear dimension that is greater than the nozzle pitch, and a mask positioned between the fluid dispenser and the balance surface, wherein the mask includes an aperture and a catch region, wherein the aperture is configured to allow fluid dispensed from the single nozzle to impact the balance surface, and the catch region is configured to catch fluid dispensed from remaining nozzles in the plurality of nozzles.

Further features of the present invention will become apparent from the following description of exemplary embodiments with reference to the attached drawings.

DESCRIPTION OF THE EMBODIMENTS

Embodiments will hereinafter be described in detail with reference to the drawings. The embodiments do not limit the recited in claims. All of combinations of features described according to the embodiments are not necessarily essential to solutions.

Figure 1:
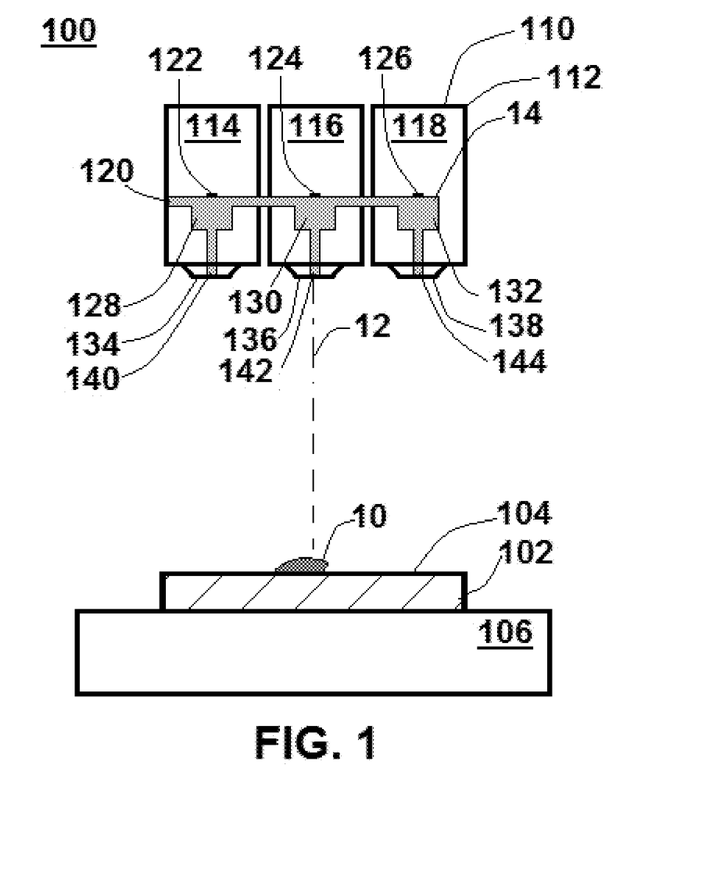
FIG. 1 is an elevated view of calibration system 100.

FIG. 1 is an elevated view of calibration system 100. The calibration system 100 may be a fluid dispenser calibration system and include a balance 102 having a balance surface 104, a base 106, and a print head 110. The print head 110 may be part of a printer such as an inkjet printer that recreates a digital image by propelling drops onto a substrate. The balance 102 is supported on the base 106 and may be used to measure mass of a fluid sample 10 created from drops 12 dispensed from fluid 14 in the print head 110. The fluid 14 may be resin, ink, or other fluid configured to be dispense from a printer.

The balance 102 is a weighing instrument that can measure very small masses. When configured as a quartz crystal microbalance (QCM), the balance 102 may use two patterned metal electrodes to apply a high frequency alternating current signal to a thin quartz crystal, oscillating it. As mass from the drops 12 is deposited on the balance surface 104 into the fluid sample 10, the natural oscillation frequency of the quartz crystal is damped. By monitoring the damping of these oscillations, the deposited mass can be calculated and drop volume determined.

The print head 110 may be a stationary or moveable part of an inkjet printer having drop-on-demand technology. For example, the inkjet printer may include droplet forming dispensers that use piezoelectric material or thermal excitation to generate pressure to move drops 12. The inkjet printer may be part of a microelectromechanical system (MEMS). In an example, the print head 110 may contain a series of nozzles 112 as printing elements. Each nozzle 112 can be controlled independently so that all or some of the nozzles 112 fire a drop 12 simultaneously, or only one nozzle 112 fires a drop 12.

The nozzles 112 may include nozzles 114, 116, and 118 which receive fluid 14 from a supply channel 120 common to, and in fluid communication with, each of the nozzles 112. The nozzles 114, 116, and 118 are illustrated in FIG. 1 side by side with a gap for clarity, but may be connected without a gap. The supply channel 120 receives fluid 14 from a fluid supply reservoir (not shown). The nozzles 114, 116, and 118 each respectively may include pressure generators 122, 124, and 126, fluid firing chambers 128, 130, and 132, flow inlet channels 134, 136, and 138 in an array, and nozzle apertures 140, 142, and 144. Each nozzle 112 may be a fluid dispenser and may control the direction or velocity and other characteristics of a fluid flow as fluid 14 exits a flow inlet channel through a nozzle aperture.

The pressure generator 124 associated with the nozzle 116 may be a piezoelectric material. The piezoelectric material may be located, for example, above the fluid firing chamber 130 as illustrated in FIG. 1 or as a side of a fluid firing chamber. In an example, the nozzles 114, 116, and 118 are a single piece construction so that the piezoelectric material associated with a first fluid firing chamber and the piezoelectric material associated with a second fluid firing chamber may be located beside one another.

Nozzles 114, 116, and 118 each have a similar operation. When configured as a piezoelectric material, the pressure generator 124 changes shape as voltage is applied to the piezoelectric material. When the piezoelectric material moves inward from an initial position into the fluid firing chamber 130 towards an extended position in response to an electrical charge, the movement pushes fluid 14 through the flow inlet channel 136 and out of the nozzle aperture 142 that sprays the drops 12 onto the balance surface 104 as the fluid sample 10. As the piezoelectric material returns towards the inlet position, the movement pulls more fluid 14 from the supply channel 120 into the fluid firing chamber 130.

During printer operations, it is common that neighboring nozzles 112 are fired simultaneously or close in time to one another. For the nozzle 116, the movement of the piezoelectric material excites fluid mechanics within the fluid firing chamber 130. Because the nozzle 116 is in physical and in fluid communication with each nozzles 114 and 118 through the common supply channel 120, the fluid mechanics in the nozzle 116 are carried into neighboring nozzles and affect nozzle firing operations in those neighboring nozzles. Likewise, the nozzle 116 is affected by excited fluid mechanics in neighboring nozzles 114 and 118. This crosstalk influencing phenomenon between neighboring fluid firing chambers and nozzles results in varying properties and characteristics of the drops 12 from multiple simultaneously actuated nozzles 112.

In nanoimprint lithography, the circuit patterns are formed using direct transfer. As such, the print head that shoots individual drops of resin requires calibration of nanometer-level accuracy. At such fine levels of accuracy, crosstalk and vibration inducing events have a greater impact on nanometer-level accuracy.

To avoid crosstalk when testing the nozzles 112, one approach is to only fire one nozzle 112 at a time. For example, U.S. Pat. No. 6,871,930 discloses an inkjet printer having nozzles and a quartz crystal microbalance that is used to measure volume of drops from a single nozzle while neighboring nozzles are not used. While this is an acceptable approach for the printing of arbitrary images with the resolution requirements of some applications, it is insufficient when calibrating nozzles for use in nanoimprint lithography manufacture of a semiconductor chip. For example, firing one nozzle 112 at a time will not provide sufficient information about actual print head 110 performance where repeating nozzle grid patterns creates a significant drop volume and placement dependence on which nozzles are being used, particularly when combined with stringent placement and residual layer thickness uniformity requirements. In addition, measured drop volume is strongly dependent on whether neighboring nozzles are being used, a trend which grows more pronounced as drop volume gets smaller. If only one nozzle is fired, drop volume will vary substantially from the volume used in actual grids. An approach is needed to measure the volume of single nozzles while still including the effects of cross-talk from neighboring nozzles.

Calibrating nozzles for use in nanoimprint lithography requires accounting for crosstalk, which involves simultaneously activating neighboring nozzles 112 while measuring mass from only one nozzle 112. The active area of a quartz crystal microbalance typically is an overlapping area between gold patterns on a top and bottom of a crystal, and a limitation of a quartz crystal microbalance for nanoimprint lithography applications is the size of the active area. A typical minimum quartz crystal microbalance detection sensitivity is ~0.5 nanograms per square centimeter (ng/cm2) and a typical sensor active area is ~0.35 cm2. By increasing the number of drops fired, mass resolution can be maintained even at small drops sizes.

In an example, the size of the active area of the balance 102 in the calibration system 100 is reduced to be less than the distance between the nozzle aperture 140 and the nozzle aperture 144 such that, when the nozzles 114, 116, and 118 are fired simultaneously, only fluid 14 from the nozzle 116 contributes to the fluid sample 10 and fluid from the nozzles 114 and 118 does not land within the active area of the balance 102.

Conventional quartz crystal microbalances have a relatively large active area. A typical active area of a conventional commercial quartz crystal microbalance is 0.25 centimeters (cm) in diameter. A nozzle pitch is a distance between adjacent nozzles 112. Here, a typical active area of a conventional commercial quartz crystal microbalance is substantially larger than the native nozzle pitch of a dispenser. By comparison, the size of a quartz crystal microbalance active area may span anywhere from 35 to 45 nozzles in a single row depending on the distance between nozzles. In a case where the active area of the balance 102 has a linear dimension that is greater than the nozzle pitch of the print head 110, the sensor active area of the balance 102 may be masked.

Figure 2:
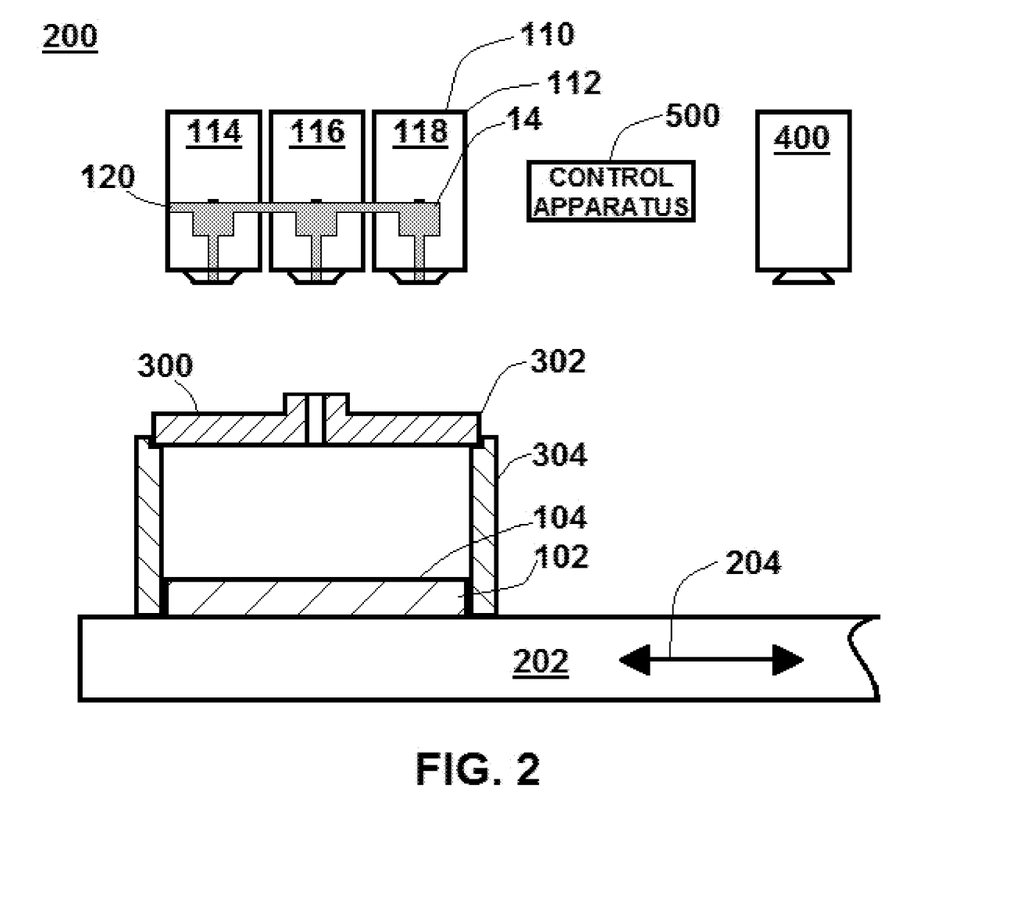
FIG. 2 is an elevated view of calibration system 200.

FIG. 2 is an elevated view of a calibration system 200. The calibration system 200 may simultaneously dispense fluid 14 from the nozzles 114, 116, and 118, use the balance 102 to obtain a mass value delivered only by the nozzle 116 under test, and compare the obtained mass value with those of a calibration standard of known accuracy. The calibration system 200 also may calculate the crosstalk effect of a dispense pattern on the ejection of fluid 14 from each of nozzles 114, 116, and 118 based on the obtained mass value and, based on the calculated crosstalk effect, adjust volume dispensed from the nozzle 116.

The calibration system 200 includes the balance 102 having the balance surface 104, which may be part of a plate, and the print head 110. The calibration system 200 additionally may include a stage 202, a mask assembly 300 having a mask 302, a mask support 304, and the balance 102, and include a camera 400 and a control apparatus 500. The stage 202 may support the mask assembly 300 and move in a horizontal direction, as shown by arrow 204, and, as z-stage, move in a vertical direction. The mask support 304 may hold the mask 302 above, away from, and relative to the balance 102. Moreover, the stage 202 supporting the mask assembly 300 may be moved so that the camera 400 can capture a photographic image or video of the mask 302. The control apparatus 500 controls the balance 102, the print head 110, the stage 202, and the camera 400. By applying a physical mask over the quartz crystal microbalance active area, a single nozzle can be interrogated while other nozzles are still fired. Drops of interest reach the measurement area through the mask 302, while drops from neighboring nozzles are diverted away.

Figure 3A:
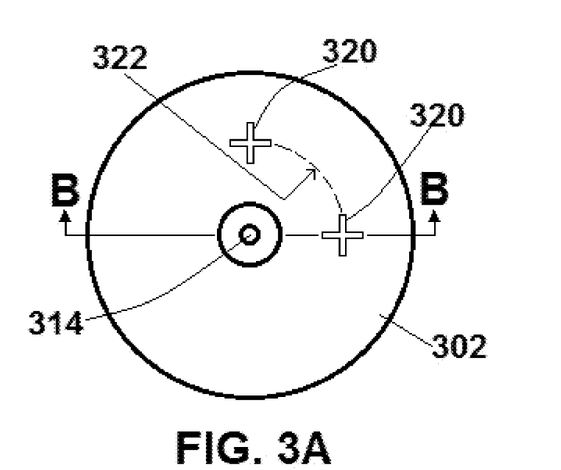
FIG. 3A is a top view of the mask 302.
Figure 3B:
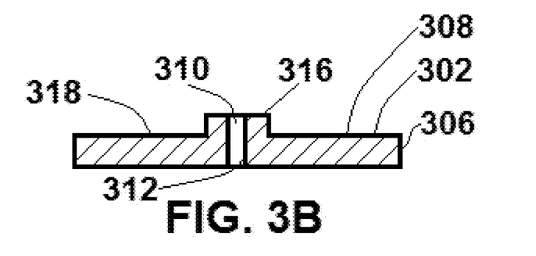
FIG. 3B is a sectional view of the mask 302 take off line B-B from FIG. 3A.

FIG. 3A is a top view of the mask 302. FIG. 3B is a sectional view of the mask 302 take off line B-B from FIG. 3A. The mask 302 may include a screen 306 having a screen surface 308, a mask aperture 310 having an inner surface 312 surrounding a center 314, a lip 316, a catch region 318, and an alignment mark 320. In an example, the mask 302 includes at least one of stainless steel, aluminum, silicon, or plastic. By using the mask 302 to cover-up parts of the sensor active area of the balance 102, drops 12 from multiple nozzles 112 can be fired simultaneously from the print head 110 while only drops from the single test nozzle aligned over the mask aperture 310 are allowed to reach the actual balance sensor.

The screen 306 may be a cover that controls passage of fluid 14 from the nozzles 112 to the balance 102. As a shelter, the screen 306 excludes drops 12 from nozzles neighboring a test nozzle that land on the screen surface 308 from passing through the mask 302 and onto the balance 102. In an example, the screen 306 may be solid and transparent, and include a circular profile having a 25.4 millimeter (mm) outside diameter.

The mask aperture 310 may be an opening through the screen 306 that allows drops 12 from a test nozzle to pass to the balance 102. The mask aperture 310 should be small enough that only one test nozzle would be measured by the balance 102, but large enough so that drops from that nozzle could easily pass through. Drops from a nozzle 112 having a one picoliter (pL) volume have approximately a 13 micrometer diameter. To account for alignment requirements and provide a large enough clearance area through which drops 12 having ~13 micrometer diameter may pass, a through-hole diameter of the mask aperture 310 is not less than 50 micrometers and may be 60 to 100 micrometers.

During printing operations of the print head 110, drops are fired from a nozzle 112 onto a moving substrate and are required to meet stringent placement targets much smaller than 60 to 100 micrometers. Thus, firing a drop 12 into and through a stationary target the size of the mask aperture 310 is achievable, even with a larger throw distance between the nozzle aperture and the mask aperture 310.

The lip 316 may be barrier that extends upward and away from the screen surface 308 to prevent drops 12 from nozzles neighboring a test nozzle from entering into the mask aperture 310. By upward curving sides around the mask aperture 310, drops from neighboring nozzles can be diverted away from the mask aperture 310 and collected to prevent contamination of the area on the balance 102 surrounding a fluid sample 10. The catch region 318 is located outside of the mask aperture 310 and any lip 316, and may catch drops 12 dispensed from nozzles 112 to prevent these drops from reaching the balance 102.

The alignment mark 320 may be a fiducial mark made to appear on the screen surface 308 in order to provide a fixed relationship between the alignment mark 320 and a center of the mask aperture 310. In an example, there may be two alignment marks 320, where each alignment mark 320 includes two lines that intersect to form a plus-shape or an x-shape. The center of each alignment mark 320 may be located a predetermined distance 322, for example one millimeter, from the center 314 of the mask aperture 310. Each alignment mark 320 may have a size that fits within a circle having a diameter of 100 micrometers. The alignment mark 320 may be flush with the screen surface 308.

FIGS. 4A-4E illustrate example sectional views of the mask 302 from that shown in FIG. 3B. Excess fluid from neighboring nozzles can be diverted away from the mask aperture 310 using a variety of methods, including using a sloped surface, sloping the entire mask 302, forming a cone, a collar, or a physical lip around the mask aperture 310, or using an anti-wetting coating that prevents fluid from flowing toward the mask aperture 310.

Figure 4A:
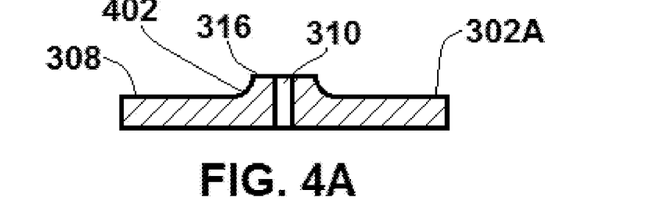
FIGS. 4A-4E illustrate example sectional views of the mask 302 from that shown in FIG. 3B.
Figure 4B:
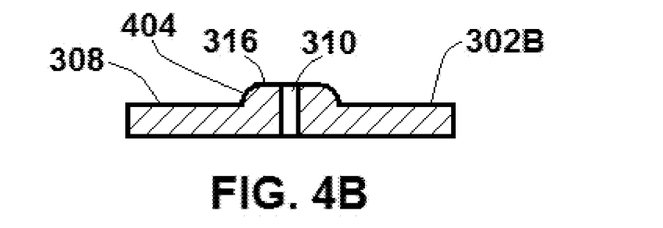

In FIG. 4A, a mask 302A having the screen surface 308 includes a concave surface 402, where a side surface of the lip 316 and the screen surface 308 are filleted with the inward curving concave surface 402 having a radius equal to a height of the lip 316. In FIG. 4B, a mask 302B having the screen surface 308 includes a convex surface 404, where an upper surface and the side surface of the lip 316 are filleted with the outward curving convex surface 404 having a radius equal to the height of the lip 316. The shape of each of the concave surface 402 and of the convex surface 404 works with gravity to divert fluid away from entering the mask aperture 310.

Figure 4C:
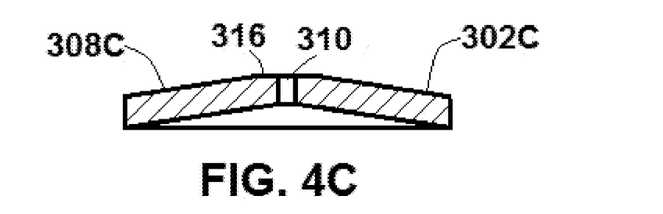
Figure 4D:
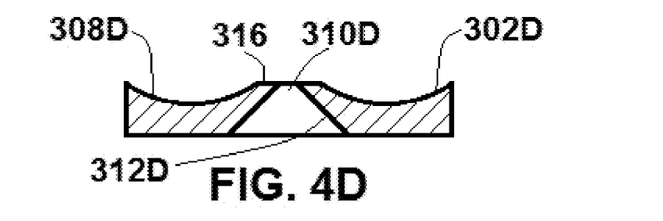
Figure 4E:
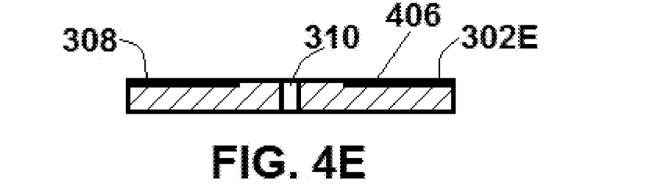

A mask 302C illustrated in FIG. 4C includes a sloped surface 308C where the entire surface of the mask 302C is slanted down and away from the mask aperture 310. FIG. 4D illustrates a mask 302D having a cupped surface 308D and a mask aperture 310D. The mask 302D includes a cupped surface 308D having a torus shape that extends down and away from the lip 316 and then extends up to form a curved catch basin within which non-test drops 12 may gather and be held away from the mask aperture 310D. The mask aperture 310D includes an inner surface 312D having a diameter that varies with the direction of gravity to lessen a likelihood that a drop 12 engages the inner surface 312D. In FIG. 4E, a mask 302E includes an anti-wetting coating 406 on or in the screen surface 308 that works towards preventing fluid from flowing to the mask aperture 310. In an example, the anti-wetting coating 406 includes a polymer composition. In another example, the mask 302E further may include a moat between the anti-wetting coating 406 and the mask aperture 310 to serve as a trench that surrounds the mask aperture 310 to further prevent fluid from flowing to the mask aperture 310

Figure 5:
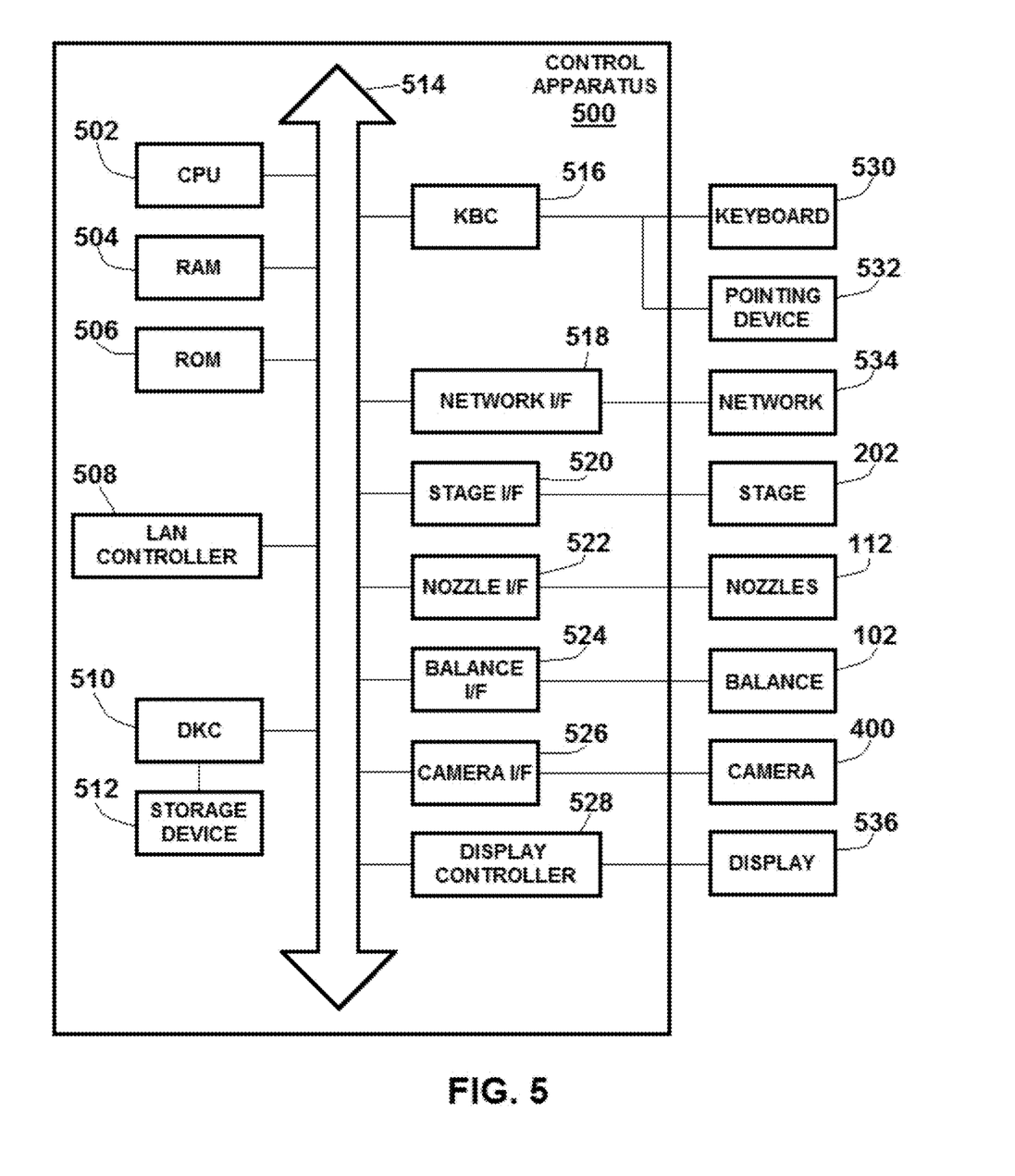
FIG. 5 is a block diagram illustrating a hardware configuration of a control apparatus 500.

FIG. 5 is a block diagram illustrating a hardware configuration of a control apparatus 500. The control apparatus 500 may include a central processing unit (CPU) 502, a random-access memory (RAM) 504, a read-only memory (ROM) 506, a local area network (LAN) controller 508, and a disk controller (DKC) 510, each of which is connected to a bus 514. The CPU 502 controls access to various devices via the bus 514 and the bus 514 may be configured to transfers data between components inside the control apparatus 500.

The CPU 502 carries out instructions by performing operations, such as logical, control, and input/output (I/O) operations, indicated by the instructions to control the operation of the control apparatus 500. The RAM 504 may function as the main memory of the CPU 502, a work area, and the like. The ROM 506 may include a nonvolatile memory feature and function as a boot ROM which stores a boot program of the control apparatus 500. The LAN controller 508 may be connected to a network that is local to an area of the control apparatus 500. The CPU 502 can communicate with different local devices via the LAN controller 508.

The DKC 510 controls access to the storage device 512. The storage device 512 may be included inside or outside of the control apparatus 500 or be separate from the control apparatus 500. The storage device 512 may be one of a hard disk (HDD), a solid-state drive (SSD), an integrated circuit (IC) card, and the like. The storage device 512 may store, for example, images, programs, data, and various setting information. The storage device 512 also may be used to store image processing jobs from the camera 400. In an example, a program stored in the storage device 512 is loaded into the RAM 504 and then executed by the CPU 502.

The control apparatus 500 additionally may include a keyboard controller (KBC) 516, a network interface (I/F) 518, a stage I/F 520, a nozzle I/F 522, a balance I/F 524, a camera I/F 526, and a display controller 528, each of which is connected to the bus 514.

The KBC 516 may receive input from a keyboard 530 and a pointing device 532, such as a computer mouse. The keyboard 530 includes software keys or hardware keys which are operated by a user pressing on a key. The network I/F 518 may be connected with a network 534, that may be in communication with local devices or in communication with remote devices through the Internet. The CPU 502 controls signal input to and output from the network I/F 518. The KBC 516 and the network I/F 518 may receive various setting information as input into the control apparatus 500.

The stage I/F 520 is connected to the stage 202. The stage I/F 500 may be designed to communicate information between the stage 202 and the control apparatus 500. The CPU 502 may cause movement signals to be sent from the stage I/F 520 to the stage 202 that cause the stage 202 to move.

The nozzle I/F 522 is connected to the nozzles 112 of the print head 110. In particular, the nozzle I/F 522 is connected to each of the pressure generators 122, 124, and 126 (FIG. 2). The CPU 502 may cause activation signals to be sent from the nozzle I/F 522 to one or more of the pressure generators 122, 124, and 126 to cause them to fire. By controlling the timing and values of the activation signals, the CPU 502 can vary the volume of fluid 14 expelled from a nozzle 112.

The balance I/F 524 is connected to the balance 102. The CPU 502 may cause signals to be sent from the balance I/F 524 to the balance 102 that turn the balance 102 off and on and to cause the balance I/F 524 to receive signals from the balance 102 that may represent mass values of a fluid sample 10.

The camera I/F 526 is connected to the camera 400 and may send signals to the camera 400 and receive image data from the camera 400. The CPU 502 may cause image signals to be sent from the camera I/F 526 as output information to the camera 400. The camera I/F 526 may output Raster Image Processing (RIP)-processed image data based on images received from the camera 400.

The display controller 528 is connected to the display 536 to control the display 536. The CPU 502 may cause image signals to be sent from the display controller 528 as output information to a display 536. The display 536 is an output device for presentation of information in visual form.

The display controller 528 may include a memory, such as an image or video memory, store image data in the video memory according to an instruction received from the CPU 502, and output stored image data as video signals to the display 536. The CPU 502 may cause information signals to be sent from the display controller 528 to the display 536. Input and other information may be displayed on the display 536. For example, the display controller 528 may cause a graphical user interface (GUI) to be displayed on the display 536, which may interact with signals from the keyboard 530 and the pointing device 532.

Figure 6:
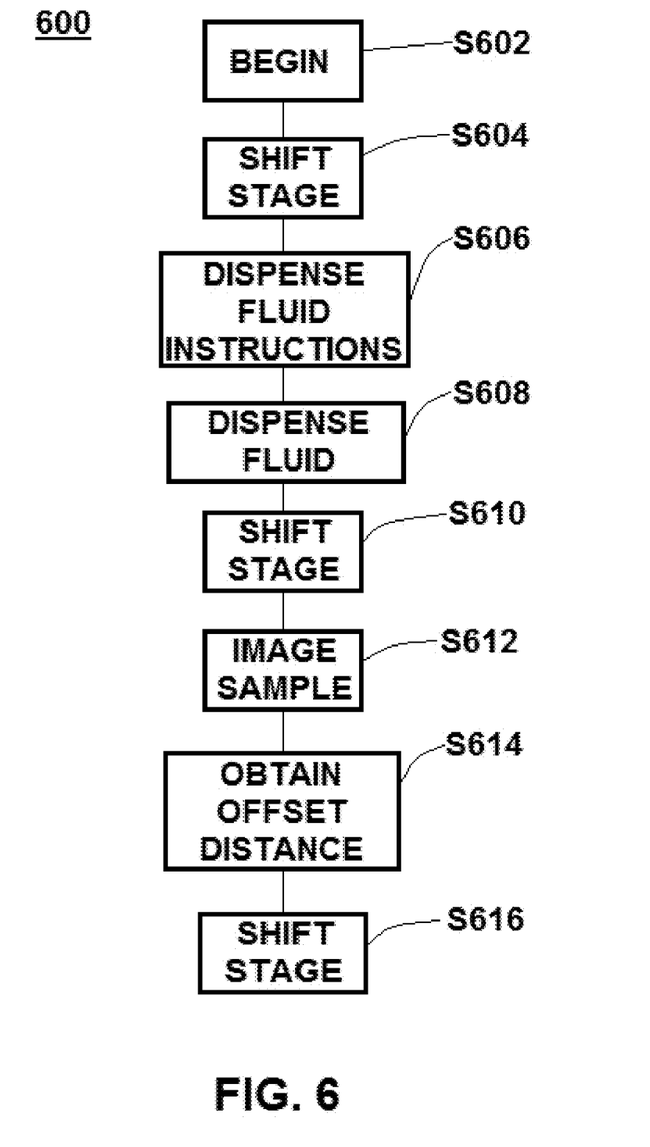
FIG. 6 is a flow chart 600 of a method to align the mask assembly 300 to the nozzles 112.

FIG. 6 is a flow chart 600 of a method to align the mask assembly 300 to the nozzles 112. The nozzle 116 will be used in this example as the test nozzle. The method of the flow chart 600 begins at step S602. As step S604, the CPU 502 of the control apparatus 500 may send a signal to the stage 202 through the stage I/F 520 to cause the stage 202 to shift horizontally so that the nozzle aperture of a test nozzle resides approximately above the alignment marks 320.

Figure 7:
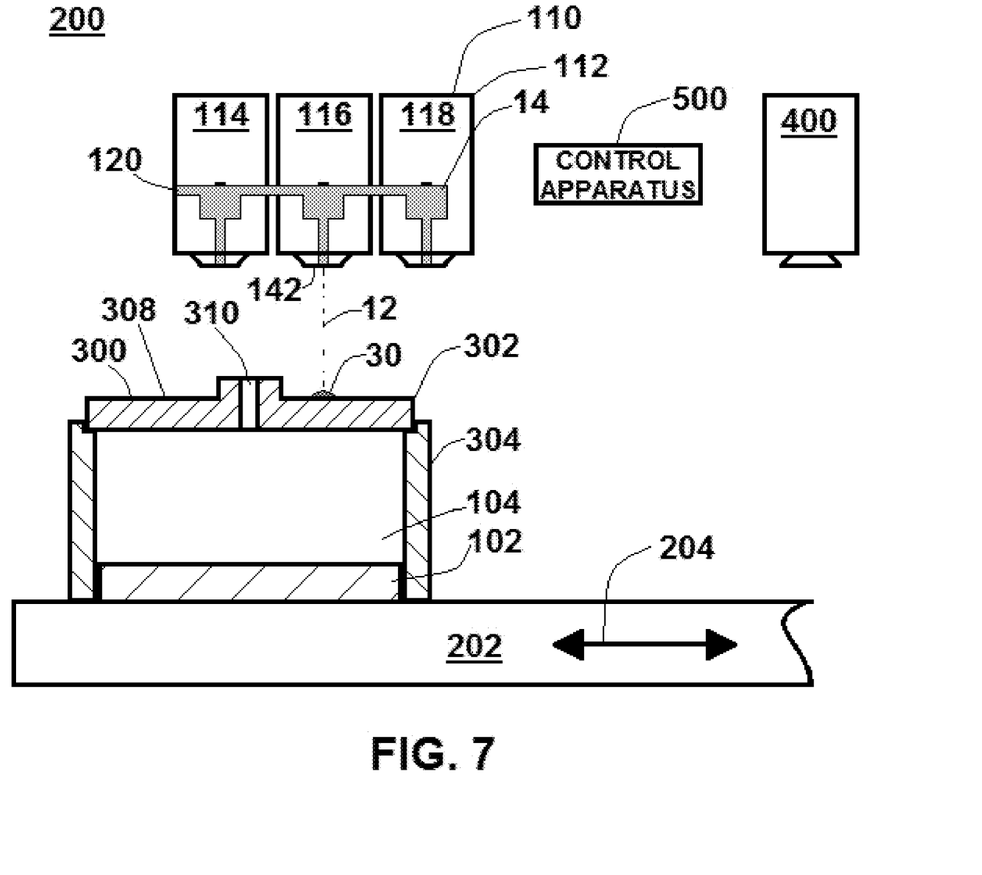
FIG. 7 illustrates the nozzle aperture 142 of the nozzle 116 residing approximately above the alignment marks 320.

FIG. 7 illustrates the nozzle aperture 142 of the nozzle 116 residing approximately above the alignment marks 320. As illustrated by FIG. 3B and FIG. 7, the alignment mark 320 may be flush with the screen surface 308 and reside at a height that is different from the upper surface of the mask aperture 310. Thus, the test gap between the nozzle aperture 142 (FIG. 7) and the screen surface 308 may be different from a target gap between the nozzle aperture 142 and the upper surface of the mask aperture 310. In a case where the alignment mark 320 is not co-planar with the upper surface of the mask aperture 310, the stage 202 maybe moved in a vertical direction at step S604 so that the test gap matches the target gap and the surface of the alignment mark 320 resides at the target gap.

Figure 8:
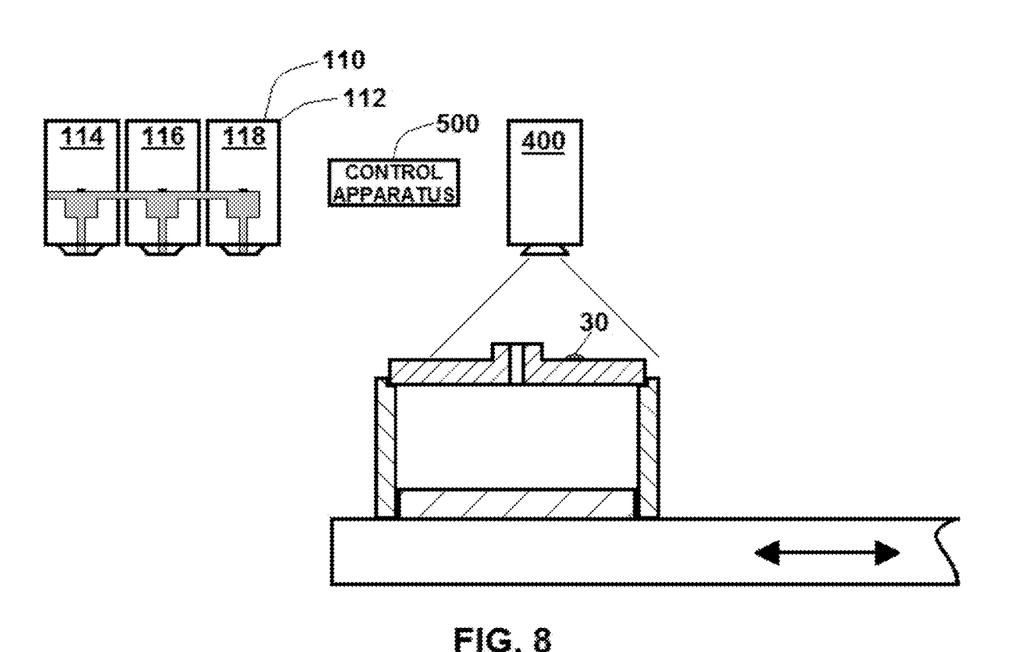
FIG. 8 illustrates the camera 400 residing approximately above the fluid sample 30 and the alignment marks 320.

At step S606, the CPU 502 may send instructions to the nozzle 116 as a fluid dispenser to dispense fluid 14 from the nozzle 116. As step S608, the nozzle 116 dispenses drops 12 onto the screen surface 308, intentionally missing the mask aperture 310, to create a fluid sample 30 on the screen surface 308 in proximity to the alignment marks 320. As step S610, the CPU 502 may send a signal to cause the stage 202 to shift horizontally so that the camera 400 resides approximately above the fluid sample 30 and the alignment marks 320. FIG. 8 illustrates the camera 400 residing approximately above the fluid sample 30 and the alignment marks 320.

Figure 9:
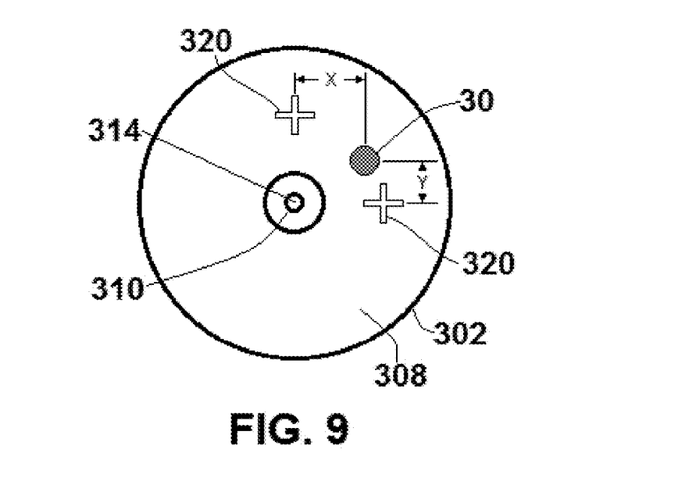
FIG. 9 is a top view of the fluid sample 30 on the mask 302.

At step S612, the CPU 502 may send a signal through the camera I/F 526 to cause the camera 400 to obtain an image of the actual position(s) of the fluid sample 30 on the mask 302. FIG. 9 is a top view of the fluid sample 30 on the mask 302. At step S614, the CPU 502 may cause image data of the obtained image to be process to obtain an offset distance between a center of the fluid sample 30 and the center 314 of the mask aperture 310 using distances between the center of the fluid sample 30 and the centers of the alignment marks 320 and the known distances between the center 314 of the mask aperture 310 and the center of the alignment marks 320. At step S616, the CPU 502 may use the determined offset distance in a signal sent to the stage 202 to cause the stage 202 to shift horizontally so that the mask aperture 310 resides directly under and aligned with the nozzle aperture of the test nozzle, the nozzle aperture 142 of the nozzle 116 in this example. As a result of the steps of the flow chart 600, the mask assembly 300 is aligned to the nozzles 112.

Figure 10:
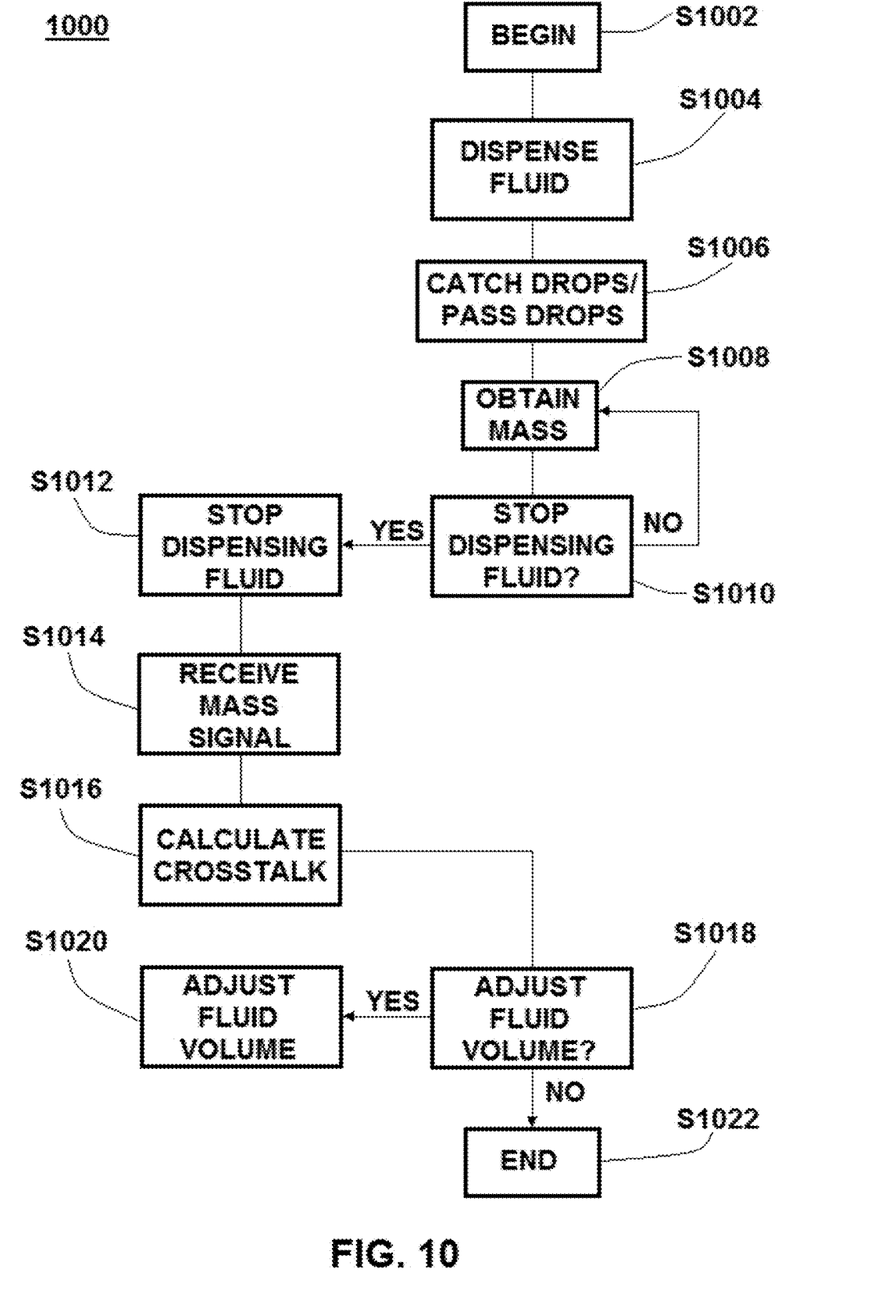
FIG. 10 is a flow chart 1000 of a method to test a nozzle while at least one other nozzle is activated.
Figure 11:
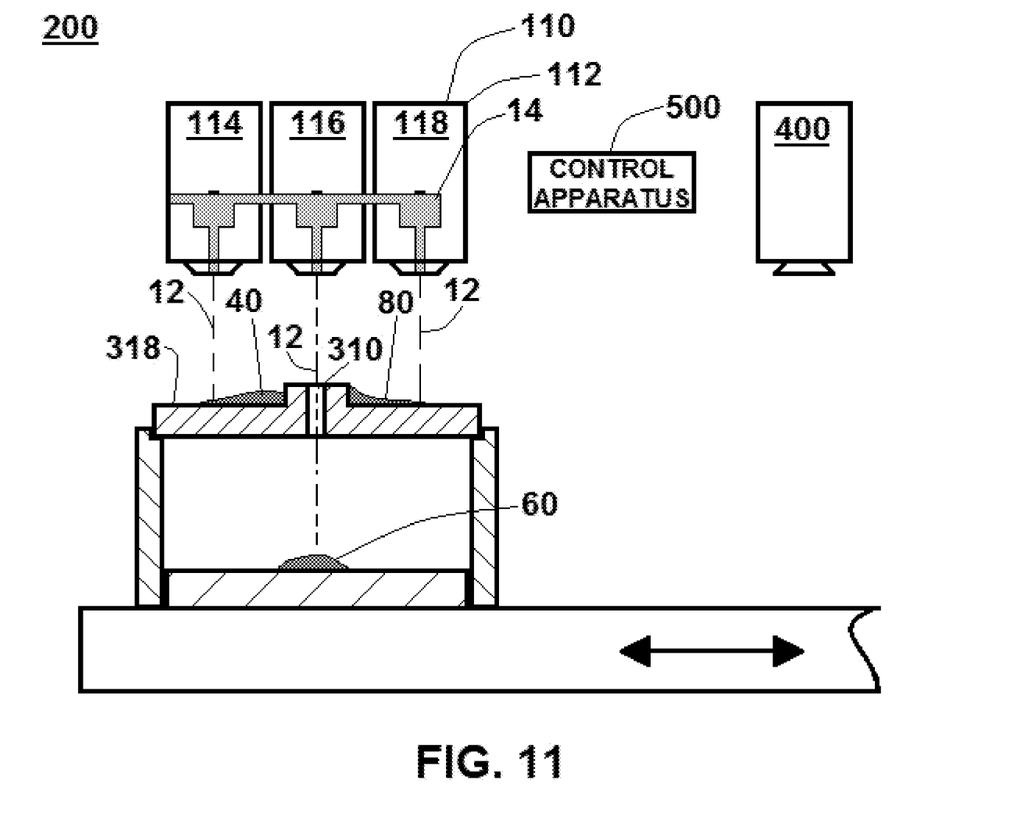
FIG. 11 illustrates an example testing of the nozzle 116 while the nozzles 114 and 118 dispense drops 12.

FIG. 10 is a flow chart 1000 of a method to test a nozzle while at least one other nozzle is activated. FIG. 11 illustrates an example testing of the nozzle 116 while the nozzles 114 and 118 dispense drops 12.

In the fluid dispenser calibration system 200 of FIG. 11, the fluid dispenser 112 includes the nozzles 114, 116, and 118 and a nozzle pitch is a distance between adjacent nozzles. The balance 102 is for measuring mass of fluid dispensed from a single nozzle among the nozzles 114, 116, and 118. The balance 102 measures a change in mass on the balance surface 104 and the balance surface 104 has a linear dimension that is greater than the nozzle pitch. The mask 302 is positioned between the fluid dispenser 112 and the balance surface 104. The mask 302 includes the mask aperture 310 that allows fluid dispensed from a single test nozzle 116 among the nozzles 114, 116, and 118 to impact the balance surface 104. The catch region 318 of the mask 302 may catch drops 12 dispensed from the remaining nozzles 114 and 118.

The method of the flow chart 10 begins at step S1002. Here, as illustrated in FIG. 11, the mask assembly 300 is aligned to the nozzles 112. The mask aperture 310 resides directly under and aligned with the nozzle aperture 142 of the test nozzle 116. The nozzle aperture 142 is large enough to allow drops 12 from the test nozzle 116 to enter and pass through the nozzle aperture 142, but small enough to prevent drops from the nozzles 114 and 118 from entering the nozzle aperture 142.

At step S1004, the CPU 502 sends instructions to the fluid dispenser 112 to dispense fluid in a dispense pattern that includes fluid from the single nozzle 116 and the nozzles 114 and 118 among the nozzles 114, 116, and 118. At step S1006, the catch region 318 of the mask 302 receives drops 12 from the nozzles 114 and 118 while at the same time the balance 102 receives drops 12 from the nozzle 116 that have passed through the nozzle aperture 310. The drops 12 from the nozzle 116 form a test sample 60 on the balance surface 104. The drops 12 from the nozzle 114 form a discard sample 40 in the catch region 318 on the mask 302 and the drops 12 from the nozzle 118 form a discard sample 80 in the catch region 318 on the mask 302. The lip 316 works with the catch region 318 to prevent fluid from either the discard sample 40 or the discard sample 80 from entering the nozzle aperture 310 and landing on the balance 102.

At step S1008, at about the same time the CPU 502 sends instructions to the fluid dispenser 112 to dispense fluid, the CPU 502 causes the balance 102 to obtain information regarding mass from the test sample 60 as the test sample 60 changes over time. At step S1010, the CPU 502 determines whether to send instructions to the fluid dispenser 112 to stop dispensing fluid. In a case where the CPU 502 determines to send instructions to the fluid dispenser 112 to stop dispensing fluid (YES at step S1010), the method proceeds to step S1012. At step S1012, the CPU 502 sends instructions to the fluid dispenser 112 to stop dispensing fluid. The method then proceeds to step S1014. In a case where the CPU 502 determines not to send instructions to the fluid dispenser 112 to stop dispensing fluid (NO at step S1010), the method returns to step S1008.

At step S1014, the CPU 502 receives information from the balance 102 that is representative of the mass of the test sample 60 dispensed onto the balance surface 104. At step S1016, the CPU 502 calculates the crosstalk effect of the dispense pattern on the ejection of fluid from each nozzles 114, 116, and 118 based on the information received. At step S1018, the CPU 202 determines whether to send instructions to the fluid dispenser 112 to adjust the volume dispensed from the single nozzle 116. In a case where the CPU 202 determines to send instructions to the fluid dispenser 112 to adjust the volume dispensed from the single nozzle 116 (YES at step S1018), the method proceeds to step S1020. At step S1020, the CPU 202 uses the calculated crosstalk effect to generate and send instructions to the fluid dispenser 112 to adjust the volume dispensed from the single nozzle 116. The method then proceeds to step S1022 and ends. In a case where the CPU 202 determines not to send instructions to the fluid dispenser 112 to adjust the volume dispensed from the single nozzle 116 (NO at step S1018), the method proceeds to step S1022 and ends.

Figure 12:
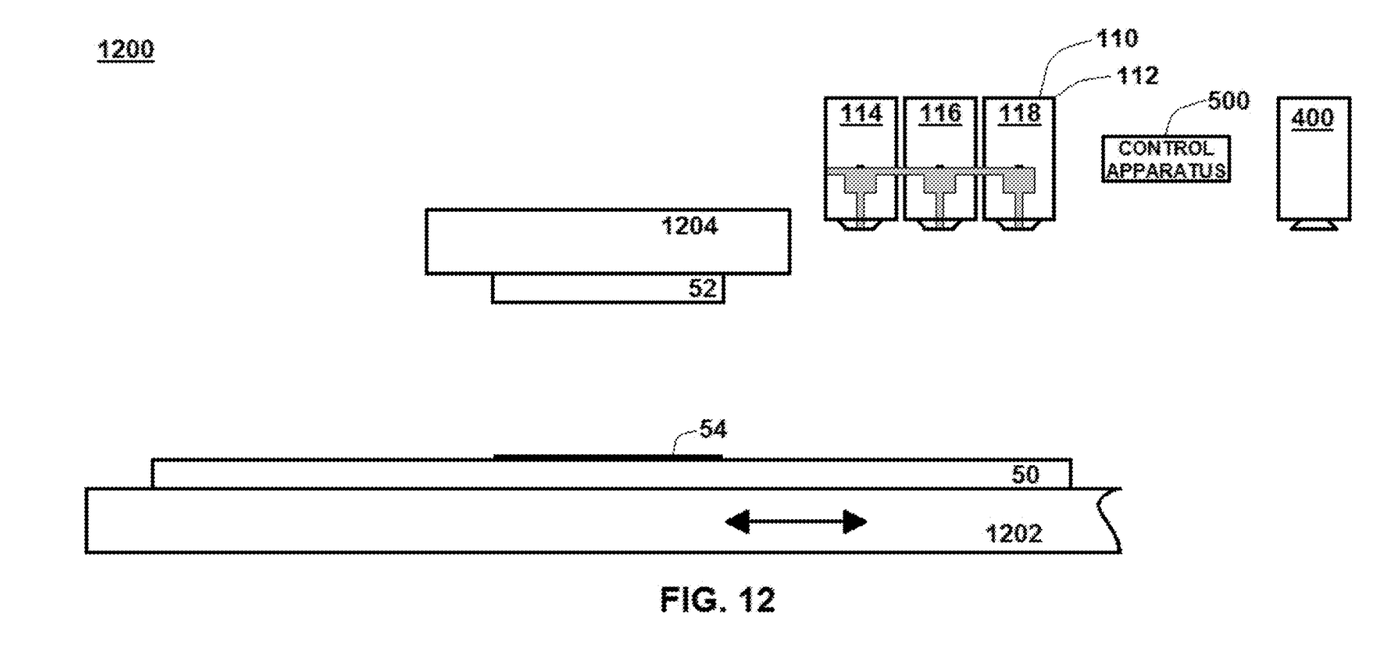
FIG. 12 illustrates an imprint apparatus 1200.

FIG. 12 illustrates an imprint apparatus 1200. The imprint apparatus 1200 may form a pattern of an imprint material on a substrate by using a mold. The imprint apparatus 1200 may include a substrate stage 1202 to hold a substrate 50, a mold stage 1204 to hold a mold 52, and include the print head 110, calibrated using a calibration system such as the calibration system 200, a detection device, such as the camera 400 further configured to detect an alignment mark formed on the substrate 50 and an alignment mark formed on the mold 52, and the control apparatus 500.

The control apparatus 500 may obtain a relative positional deviation between the substrate 50 and the mold 52 from results of detection of the alignment marks of the substrate 50 and the mold 52 detected by the detection device. Signals from the control apparatus 500 may cause the substrate stage 1202 and/or the mold stage 1204 to be moved horizontally or vertically and be rotated or tilted to align them to each other based on information from the detection device.

The nozzles 112, including nozzles 114, 116, and 118, of the print head 110, calibrated using a calibration system, may supply imprint material 54 onto the aligned substrate 50. The imprint material 54 may be an ultraviolet-cured (UV-cured) resin that is cured by being irradiated with a UV-ray. To supply the imprint material 54 onto the substrate 50, the nozzles 112 shoot individual drops of fluid resin onto the substrate 50 so that the drops follow a circuit pattern. Then, the control apparatus 500 performs control to cause the mold 52 having a nano-circuit pattern to be brought into direct contact with the resist material 54 on the surface of the substrate 50. The nano-pattern mold 52 is pressed into the fluid resist material 54 to fabricate the resist material 54 into minute circuit patterns on the substrate 50. The control apparatus 500 then performs control to cause ultraviolet light to illuminate the resist to solidify the resist and form the circuit pattern on the substrate 50, after which the mold 52 is separated from the substrate 50, which now has a residual layer made up of an extremely sharp circuit pattern.

The calibration system includes hardware and methodology to allow the measurement of drop volume from individual nozzles below an optical diffraction limit, using realistic grids for nanoimprint lithography applications. A physical mask applied to a quartz crystal microbalance mass measurement system allows the measurement of drop volume from a single nozzle while a variety of different grid patterns are tested. An aperture of ~50-60 micrometers is large enough to allow drops from the measured nozzle to reach the target, while curved sides divert drops from neighboring nozzles away from the measurement area.

Additional on-tool dispenser measurement may be critical to quickly install dispensers and maintain their performance. In particular, conventional accurate drop volume data is difficult to obtain because wafers must be removed from a tool and measured offline. On-tool volume measurement would improve monitoring and performance. In this regard, the calibration system may be included in multiple tools, including calibration tools such as a drop-and-cure bench or in imprint tools. A quartz crystal microbalance included as a part of an imprint tool allows volume monitoring as part of testing between lots or as part of periodic maintenance to help ensure continued performance levels and reduce system downtime.

The disclosed calibration system provides additional hardware to improve the effective spatial resolution of quartz crystal microbalance measurement. The system allows drop volumes to be measured using drop patterns designed for imprint applications, providing a more realistic measure of performance under actual imprint conditions. Further, the system provides a benefit over simply patterning a smaller quartz crystal microbalance active area, while preventing neighboring drops spreading and merging with test drops of interest.

The above embodiments can be carried out also in the case where programs that achieve the functions according to the above embodiments are supplied to a system or an apparatus via a network or a storage medium and processors of a computer of the system or the apparatus perform the programs. The above embodiments can be carried out also by using a circuit (for example, ASIC) having the functions.

Embodiment(s) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

What is claimed is:

1. A fluid dispenser calibration system comprising:
   a fluid dispenser having a plurality of nozzles, wherein a nozzle pitch is a distance between two adjacent nozzles;
   a balance having a balance surface and configured to measure mass of fluid dispensed from a single nozzle among the plurality of nozzles, wherein the balance is configured to measure a change in mass on the balance surface, and wherein the balance surface has a linear dimension that is greater than the nozzle pitch; and
   a mask positioned between the fluid dispenser and the balance surface, wherein the mask includes an aperture and a catch region,
   wherein the aperture is configured to allow fluid dispensed from the single nozzle to impact the balance surface, and the catch region is configured to catch fluid dispensed from remaining nozzles in the plurality of nozzles.

2. The fluid dispenser calibration system according to claim 1, where the fluid dispenser is a print head.

3. The fluid dispenser calibration system according to claim 1, wherein the balance is a quartz crystal microbalance.

4. The fluid dispenser calibration system according to claim 1, wherein the mask further includes a screen having a screen surface and a lip that surrounds the aperture and extends up and away from the screen surface.

5. The fluid dispenser calibration system according to claim 1, wherein the catch region is slanted down and away from the aperture.

6. The fluid dispenser calibration system according to claim 1, wherein the catch region includes an anti-wetting coating.

7. The fluid dispenser calibration system according to claim 1, further comprising a processor configured to:
send instructions to the fluid dispenser to dispense fluid in a dispense pattern that includes fluid from the single nozzle and at least one other nozzle among the plurality of nozzles,
receive information that is representative of the mass of fluid dispensed onto the balance surface, and
calculate the crosstalk effect of the dispense pattern on the ejection of fluid from each nozzle based on the information received.

8. The fluid dispenser calibration system according to claim 7, wherein the processor further is configured to send, based on the calculated crosstalk effect, instructions to the fluid dispenser to adjust fluid volume dispensed from the single nozzle.

9. A method for a fluid dispenser calibration system, wherein the fluid dispenser calibration system includes a fluid dispenser having a plurality of nozzles, wherein a nozzle pitch is a distance between two adjacent nozzles, a balance having a balance surface and configured to measure mass of fluid dispensed from a single nozzle among the plurality of nozzles, wherein the balance is configured to measure a change in mass on the balance surface, and wherein the balance surface has a linear dimension that is greater than the nozzle pitch, and a mask positioned between the fluid dispenser and the balance surface, wherein the mask includes an aperture and a catch region, wherein the aperture is configured to allow fluid dispensed from the single nozzle to impact the balance surface, and the catch region is configured to catch fluid dispensed from remaining nozzles in the plurality of nozzles, the method comprising:
sending instructions to the fluid dispenser to dispense fluid in a dispense pattern that includes fluid from the single nozzle and at least one other nozzle among the plurality of nozzles;
receiving information that is representative of the mass of fluid dispensed onto the balance surface; and
calculating the crosstalk effect of the dispense pattern on the ejection of fluid from each nozzle based on the information received.

10. The method according to claim 9, further comprising sending, based on the calculated crosstalk effect, instructions to the fluid dispenser to adjust fluid volume dispensed from the single nozzle.

11. An imprint apparatus to form a pattern of an imprint material on a substrate by using a mold, the imprint apparatus comprising:
a fluid dispenser having a plurality of nozzles configured to apply the imprint material onto the substrate; and
a processor configured to send the nozzle instructions to a nozzle of the plurality of nozzles to dispense the imprint material on the substrate,
wherein the nozzle instructions sent by the processor are based on a calibration process performed by a fluid dispenser calibration system, wherein the fluid dispenser calibration system includes the fluid dispenser, wherein a nozzle pitch is a distance between two adjacent nozzles, and includes the processor, a balance having a balance surface and configured to measure mass of fluid dispensed from a single nozzle among the plurality of nozzles, wherein the balance is configured to measure a change in mass on the balance surface, and wherein the balance surface has a linear dimension that is greater than the nozzle pitch, and a mask positioned between the fluid dispenser and the balance surface, wherein the mask includes an aperture and a catch region, wherein the aperture is configured to allow fluid dispensed from the single nozzle to impact the balance surface, and the catch region is configured to catch fluid dispensed from remaining nozzles in the plurality of nozzles, wherein the calibration process includes:
sending instructions to the fluid dispenser to dispense fluid in a dispense pattern that includes fluid from a single nozzle and at least one other nozzle among the plurality of nozzles,
receiving information that is representative of the mass of fluid dispensed onto the balance surface, and
calculating the crosstalk effect of the dispense pattern on the ejection of fluid from each nozzle based on the information received.

12. The imprint apparatus according to claim 11, where the fluid dispenser is a print head.

13. The imprint apparatus according to claim 11, wherein the balance is a quartz crystal microbalance.

14. The imprint apparatus according to claim 11, wherein the mask further includes a screen having a screen surface and a lip that surrounds the aperture and extends up and away from the screen surface.

15. The imprint apparatus according to claim 11, wherein the catch region is slanted down and away from the aperture.

16. The imprint apparatus according to claim 11, wherein the catch region includes an anti-wetting coating.

17. The imprint apparatus according to claim 11, wherein, as part of the calibration process, the processor is configured to:
send instructions to the fluid dispenser to dispense fluid in a dispense pattern that includes fluid from the single nozzle and at least one other nozzle among the plurality of nozzles,
receive information that is representative of the mass of fluid dispensed onto the balance surface, and
calculate the crosstalk effect of the dispense pattern on the ejection of fluid from each nozzle based on the information received.

18. The imprint apparatus according to claim 17, wherein the processor further is configured to send, based on the calculated crosstalk effect, instructions to the fluid dispenser to adjust the volume dispensed from the single nozzle.

* * * * *